United States Patent
Li et al.

(10) Patent No.: US 10,227,759 B2
(45) Date of Patent: Mar. 12, 2019

(54) SENSOR-OPERATED PULL-OUT FAUCET

(71) Applicant: AS IP Holdco, LLC, Piscataway, NJ (US)

(72) Inventors: Hsiao Chang Li, Edison, NJ (US); Frank Seggio, Wayside, NJ (US)

(73) Assignee: AS IP Holdco, LLC, Piscataway, NJ (US)

( * ) Notice: Subject to any disclaimer, the term of this patent is extended or adjusted under 35 U.S.C. 154(b) by 74 days.

(21) Appl. No.: 14/978,852

(22) Filed: Dec. 22, 2015

(65) Prior Publication Data

US 2016/0177551 A1    Jun. 23, 2016

Related U.S. Application Data

(60) Provisional application No. 62/096,045, filed on Dec. 23, 2014.

(51) Int. Cl.
| | |
|---|---|
| *E03C 1/05* | (2006.01) |
| *E03C 1/04* | (2006.01) |
| *G01R 33/07* | (2006.01) |

(52) U.S. Cl.
CPC .............. *E03C 1/057* (2013.01); *G01R 33/07* (2013.01); *E03C 2001/0415* (2013.01); *Y10T 137/9464* (2015.04)

(58) Field of Classification Search
None
See application file for complete search history.

(56) References Cited

U.S. PATENT DOCUMENTS

| | | | |
|---|---|---|---|
| 6,220,297 B1 | 4/2001 | Marty | |
| 6,962,168 B2 | 11/2005 | McDaniel et al. | |
| 7,464,418 B2 | 12/2008 | Seggio et al. | |
| 7,690,395 B2 | 4/2010 | Jonte | |

(Continued)

FOREIGN PATENT DOCUMENTS

| | | |
|---|---|---|
| CN | 101137797 | 6/2010 |
| CN | 101563561 | 5/2011 |

(Continued)

OTHER PUBLICATIONS

MotionSense Support: Installation, Cleaning & Troubleshooting—Moen; For Professionals: Moen Pro Commercial; http://www.moen.com/motionsense/support; retrieved Nov. 19, 2014; 3 pages.

(Continued)

*Primary Examiner* — Craig Schneider
*Assistant Examiner* — Frederick D Soski
(74) *Attorney, Agent, or Firm* — Morrison & Foerster LLP (57) ABSTRACT

A sensor-operated pull-out faucet can include a spout having a hose disposed therein, a pull-out spray head fluidly coupled to the hose and configured to dock at an end of the spout, and a sensor assembly disposed at least partially in the spout proximate the end of the spout. The sensor assembly can include a sensor and a shutter disposed adjacent the sensor. The shutter can be operable to obscure the sensor in a closed state and expose the sensor in an open state. The faucet can also include a control unit communicatively coupled to the sensor and configured to control fluid flow through the hose and the pull-out spray head based on control signals generated by the sensor.

14 Claims, 9 Drawing Sheets

(56) References Cited

U.S. PATENT DOCUMENTS

| | | | |
|---|---|---|---|
| 7,997,301 | B2 | 8/2011 | Marty et al. |
| 8,104,113 | B2 | 1/2012 | Rodenbeck et al. |
| 8,118,240 | B2 | 2/2012 | Rodenbeck et al. |
| 8,276,878 | B2 | 10/2012 | Parsons |
| 9,828,751 | B2 * | 11/2017 | Parikh ..................... E03C 1/057 |
| 2006/0200903 | A1 | 9/2006 | Rodenbeck et al. |
| 2007/0057215 | A1 * | 3/2007 | Parsons ..................... E03C 1/05 251/129.04 |
| 2007/0157978 | A1 | 7/2007 | Jonte |
| 2007/0228310 | A1 * | 10/2007 | Esche ..................... E03C 1/057 251/129.04 |
| 2008/0189850 | A1 | 8/2008 | Seggio |
| 2010/0327197 | A1 | 12/2010 | Parsons |
| 2011/0155932 | A1 * | 6/2011 | Jonte ..................... E03C 1/057 251/129.01 |
| 2012/0305118 | A1 * | 12/2012 | Itazu ..................... E03C 1/057 137/801 |
| 2013/0248620 | A1 * | 9/2013 | Evans ..................... E03C 1/04 239/195 |
| 2014/0053906 | A1 | 2/2014 | Esche et al. |
| 2014/0054478 | A1 * | 2/2014 | Esche ..................... F16K 31/05 251/129.03 |
| 2014/0109985 | A1 | 4/2014 | Itazu et al. |
| 2014/0116553 | A1 | 5/2014 | Schoolcraft |
| 2014/0345726 | A1 | 11/2014 | Seggio et al. |
| 2014/0352799 | A1 * | 12/2014 | Rosko ..................... C02F 1/78 137/237 |
| 2015/0101121 | A1 * | 4/2015 | Burgo, Sr. ............ E03C 1/0404 4/668 |

FOREIGN PATENT DOCUMENTS

| | | |
|---|---|---|
| CN | 103629412 | 4/2017 |
| WO | 2014050225 | 4/2014 |

OTHER PUBLICATIONS

Moen Arbor MotionSense Single-Handle Pull-Down Sprayer Kitchen Reflex in Chrome; Product Overview; Model #7594EC; Internet # 203399552; Store SO SKU # 477898; http://www.homedepot.com/p/MOEN-Arbor-MotionSense-Single-Handle-Pull-Down-Sp . . . ; retrieved Nov. 19, 2014; 1 page.

International Search Report International Application No. PCT/US2015/67426, Filing Date Dec. 22, 2015, dated Mar. 10, 2016.

Office Action dated Mar. 13, 2018, directed to NL Application No. 2017-000082; 8 pages.

Partial Supplementary European Search Report dated Aug. 8, 2018, directed to EP Application No. 15874318.7; 13 pages.

Extended European Search Report dated Nov. 15, 2018, directed to EP Application No. 15874318.7; 11 pages.

Notice of Preliminary Rejection dated Oct. 26, 2018, directed to KR Application No. 10-2017-7020127; 10 pages.

Substantive Report dated Oct. 18, 2018, directed to CL Application No. 2017016666; 24 pages.

Office Action dated Oct. 23, 2018, directed to CN Application No. 201580076741.0; 16 pages.

* cited by examiner

SENSOR-OPERATED PULL-OUT FAUCET

CROSS-REFERENCE TO RELATED PROVISIONAL APPLICATION

This application claims the benefit of U.S. Provisional Application No. 62/096,045, filed on Dec. 23, 2014, the disclosure of which is hereby incorporated by reference herein in its entirety.

FIELD OF THE INVENTION

The present invention generally relates to sensor operated pull-out faucets.

BACKGROUND OF THE INVENTION

Many commercially available faucets come equipped with sensors integrated into or arranged in the vicinity of the spout that facilitate touch-free operation of the faucet. Sensors may sense the presence of a user's hands under the faucet and generate signals that instruct an electronic control unit to permit water to flow through the spout. Faucets with pull-out spray heads that help to ease the process of cleaning items placed under the tap are also known. Pull-out spray heads are typically removably docked with the spout, and each time the spray head is attached or detached from the spout, elements of the spray head and spout may be subject to shocks, strains, or other forces. Because pull-out faucets encounter stresses not typically found in fixed faucets, sensor mounting arrangements used in fixed faucets may not be suitable for pull-out faucets.

SUMMARY OF THE INVENTION

Generally speaking, it is an object of the present invention to provide a sensor-operated pull-out faucet that avoids disadvantages of conventional constructions.

According to an exemplary embodiment, a faucet includes a spout having a hose disposed therein, a pull-out spray head fluidly coupled to the hose and configured to dock at an end of the spout, and a sensor assembly disposed at least partially in the spout proximate the end of the spout. The sensor assembly includes a sensor and a shutter disposed adjacent the sensor. The shutter is operable to obscure the sensor in a closed state and expose the sensor in an open state. The faucet also includes a control unit communicatively coupled to the sensor and configured to control fluid flow through the hose and the pull-out spray head based on control signals generated by the sensor.

According to another exemplary embodiment, a sensor system for a pull-down faucet is provided. The sensor system includes a control unit, a sensor assembly, and at least one wire electrically coupling the sensor assembly to the control unit. The sensor assembly has a bezel and a lens assembly detachably coupled to the bezel. The bezel includes a central spine having an aperture defined therein. The lens assembly includes a sensor and a lens at least partially exposed in the aperture when the lens assembly is coupled to the bezel.

In accordance with embodiments of the present invention, a sensor-operated pull-out faucet can be selectively operated between a hands-free automatic mode and a normal, manual mechanical mode. The faucet can include a spout tube that houses a retractable hose and a sensor assembly, including a sensor lens, a shutter (e.g., a lens shutter), and a lens bezel. These components, along with a flexible wire harness, which can span the length of the spout tube, can be preassembled and inserted into the spout tube.

When the lens bezel is inserted (e.g., snapped) into the spout tube, the bezel can "expand" and exert spring forces that urge the bezel radially against the walls of the spout tube. This force can lock a rim of the lens bezel into an opening formed near the end of the tube. The sensor lens and shutter can be arranged in/under the opening in the spout tube, and power/control wires extending from the sensor lens can be guided through the wire harness. Control signals received from the sensor can be carried down the wires to a solenoid valve of a control unit that controls the flow of water through the faucet in the hands-free automatic sensor-based mode.

A hose guide can be inserted into the spout tube to guide the pull-out hose during extension and retraction thereof. The hose guide can prevent the hose from rubbing against the lens bezel and the spout tube. The hose guide can be clipped or otherwise fixed to one of the lens subassembly components or the spout tube.

The faucet can also include a manual control valve adjustable to configure the faucet to operate in the manual control mode (in which water flow through the faucet is controlled solely via adjustment of a mixing valve assembly that may include a faucet handle and a mixing valve), or to be freely switchable, by means of the sensor and/or shutter, between the sensor-based and manual control modes.

Still other objects and advantages of the present invention will in part be obvious and will in part be apparent from the specification.

The present invention accordingly comprises the features of construction, combinations of elements, and arrangement of parts, all as exemplified in the constructions herein set forth.

BRIEF DESCRIPTION OF THE DRAWINGS

For a fuller understanding of the inventive embodiments, reference is had to the following description taken in connection with the accompanying drawings in which.

DETAILED DESCRIPTION OF THE PREFERRED EMBODIMENTS

Figure 1:
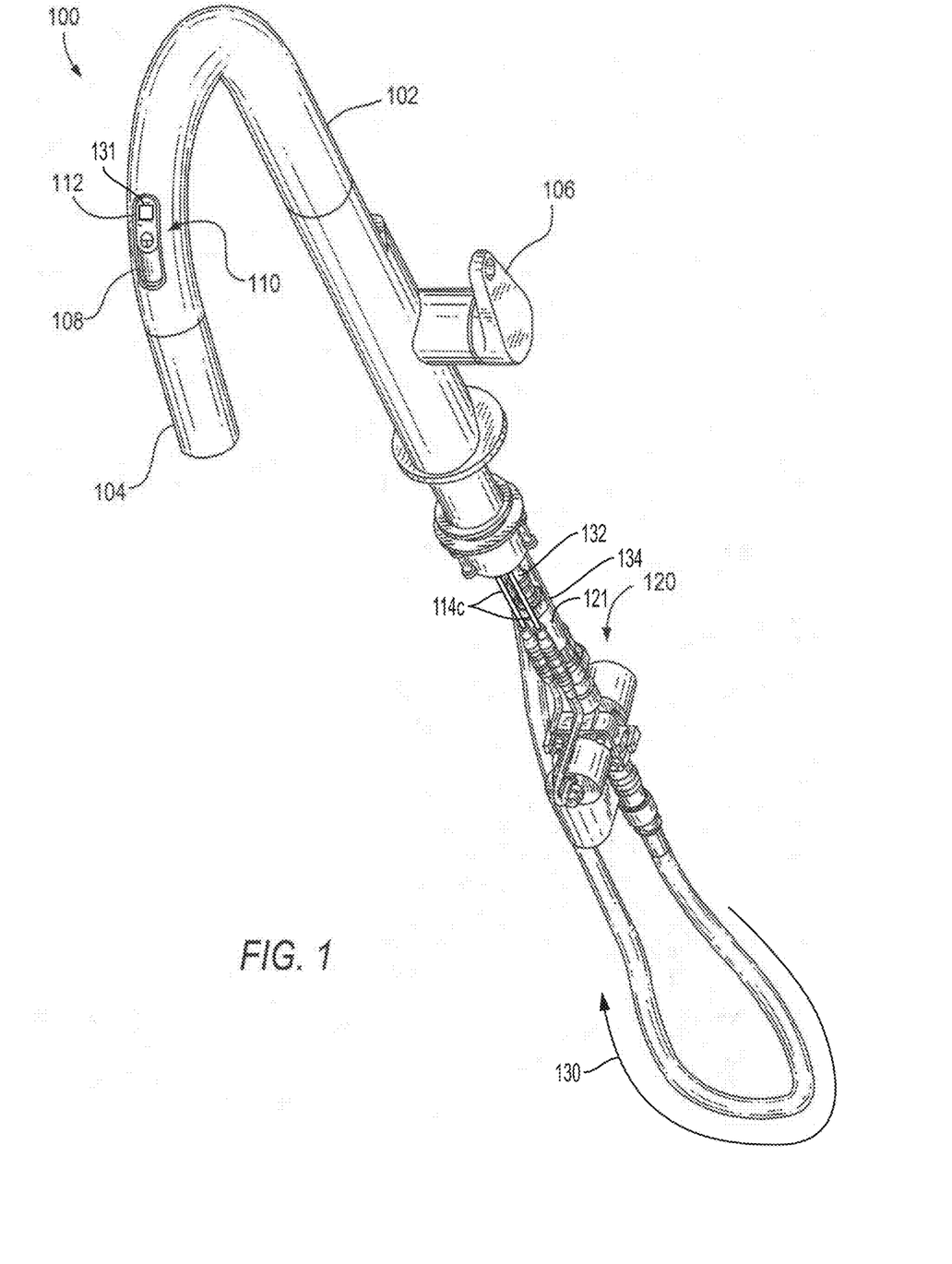
FIG. 1 is a perspective view of an exemplary sensor-operated pull-out faucet, in accordance with an embodiment of the present invention.
Figure 2:
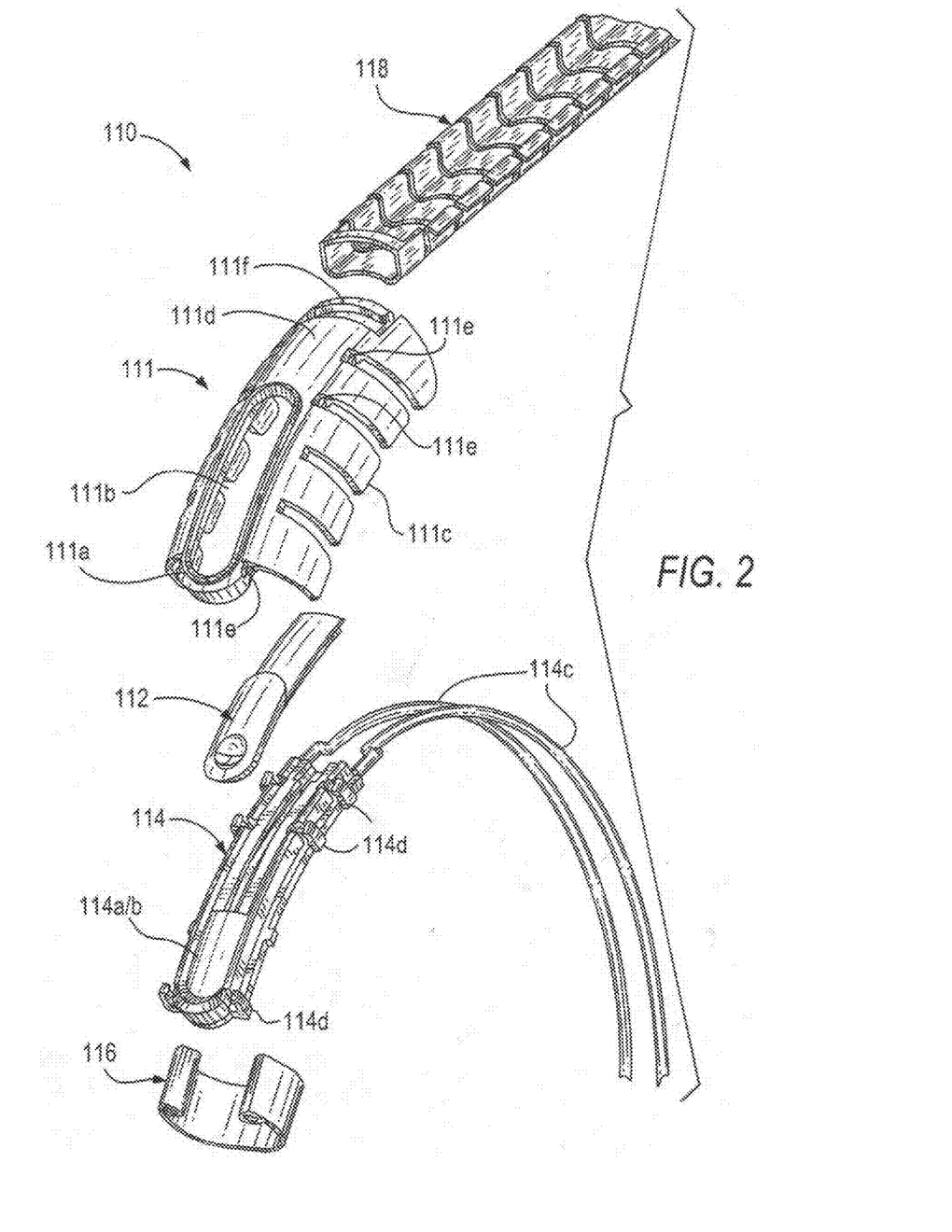
FIG. 2 is an exploded view of the pull-out faucet embodiment of FIG. 1.
Figure 3:
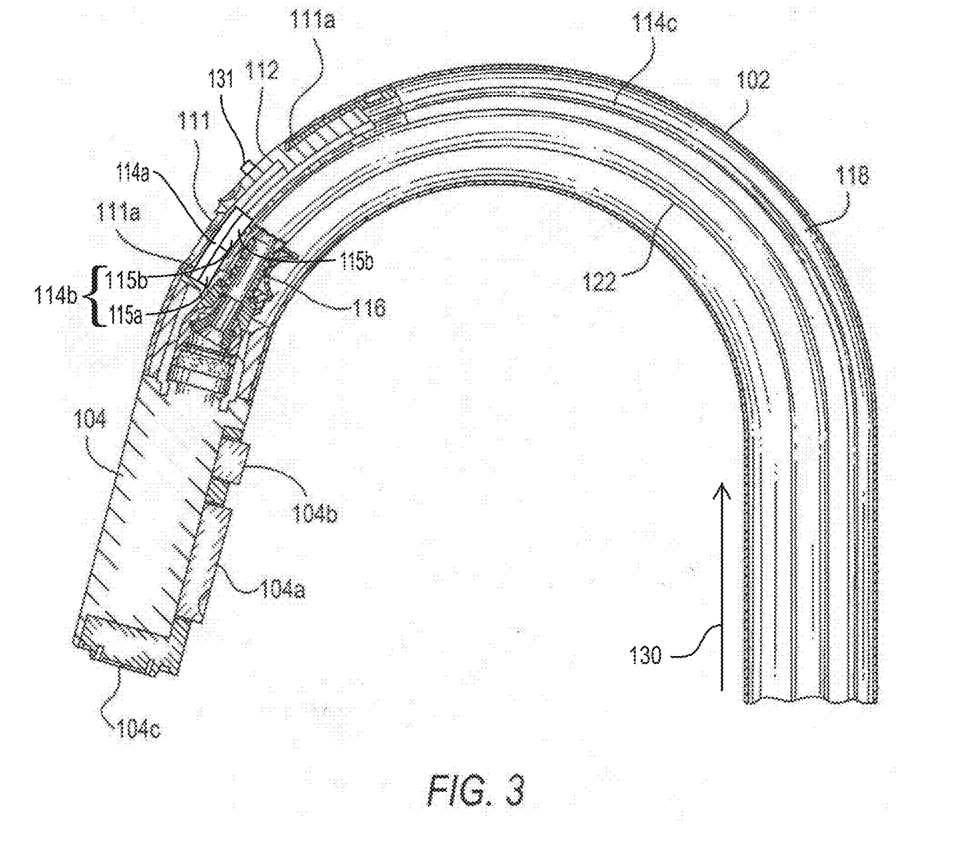
FIG. 3 is an assembled cross-sectional view of the pull-out faucet embodiment of FIGS. 1 and 2.
Figure 4:
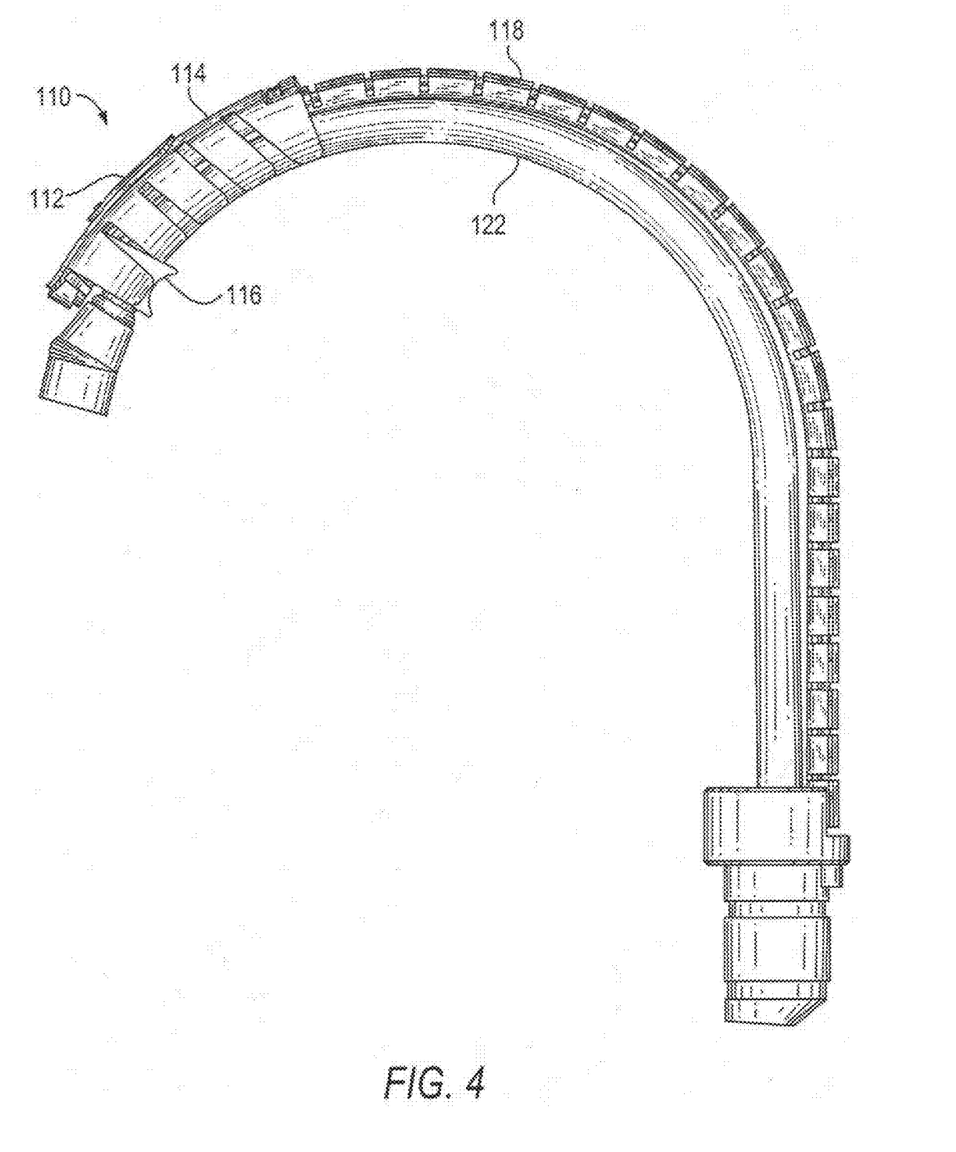
FIG. 4 is a side view of the pull-out faucet embodiment of FIGS. 1-3.

Referring now to the drawings, FIG. 1 is a perspective view of an exemplary faucet 100, in accordance with an embodiment of the present invention. FIGS. 2-4 are exploded, cross-sectional, and side views of faucet 100. Faucet 100 has a spout 102, a pull-out spray head 104, the mixing valve assembly 106, a spout aperture 108 formed in spout 102, a sensor assembly 110 located at least partially inside spout 102, and a control unit 120. Sensor assembly 110 can allow operation of faucet 100 in a hands-free automatic sensor-based mode. Faucets operable in an automatic, sensor-based mode, for example, are described in U.S. Pat. No. 7,464,418, the disclosure of which is hereby incorporated by reference herein in its entirety. Spray head 104, shown in its docked position in FIG. 1, can be detachably coupled to spout 102 using one or more suitable docking mechanisms, such as, for example, a press fit, a counterweighted hose, a magnetic coupling, and/or an auto-retracting docking assembly. During operation of faucet 100, regardless of whether spray head 104 is in an extended position or its docked position relative to spout 102, water can flow out from a tap (e.g., tap 104c of FIG. 3) via a hose (e.g., output hose 122 of FIG. 3) and an internal conduit of spray head 104.

Although faucet 100 can be operated in the sensor-based mode, handle of mixing valve assembly 106 can allow manual operation thereof as well. Handle of mixing valve assembly 106 can be a conventional handle physically coupled to and configured to adjust a mixing valve (not visible in the figures) of mixing valve assembly 106 to control the temperature of the water dispensed from faucet 100. When faucet 100 is operated in the sensor-based mode, mixing valve assembly 106 can be adjusted to remain open with the user's preferred flow rate and water temperature settings.

Referring to FIG. 3, spray head 104 can include one or more actuatable members 104a, 104b for adjusting the flow of water from tap 104c. For example, actuatable members 104a, 104b can be configured to switch the flow of water through spray head 104 between a stream mode and a spray mode.

In various embodiments, sensor assembly 110 can include a sensor 114b configured to detect the presence of objects (such as, for example, a user's hands) in proximity of spout 102 and effect automatic dispensing of water. Sensor assembly 110 can be integrated into faucet 100 (e.g., at least partially within spout 102) such that it is easy accessible to a user. As illustrated in FIG. 1, sensor assembly 110 can be positioned in spout aperture 108 located on a topside of spout 102 (e.g., proximate the end of the spout to which spray head 104 is docked). This is in contrast to conventional sensor-operated faucets, which typically employ sensors proximate the front base portion of the spout or faucet hub.

Referring to FIG. 2, sensor assembly 110 can include a lens bezel 111, a lens assembly 114, a shutter 112, a hose guide 116, and a wire harness 118. Lens bezel 111 can be configured to secure the various components of sensor assembly 110 within spout 102. In various embodiments, the shape and dimensions of lens bezel 111 can be defined such that the bezel can be compressively stressed radially within spout 102. By virtue of the compressive stress, lens bezel 111 can be urged radially toward the inner surface of the spout tube, pushing, on one side, against wire harness 118 and, on the other, towards the end of spout 102, thereby retaining lens bezel 111 in place relative to the spout. In various embodiments, lens bezel 111 can be a c-shaped member having a central spine 111d and a series of ribs 111c extending transversely from the spine. Ribs 111c can correspond to the shape of spout 102, and can be disposed between wire harness 118 and an edge of spout aperture 108. The geometry of lens bezel 111 can, for example, facilitate the advantageous compressive radial stress imparted by the inner surface of spout 102. Lens bezel 111 can also include a series of notches 111e located on either side of central spine 111d. Notches 111e can be configured to promote coupling between lens bezel 111 and lens assembly 114. Lens bezel 111 can also include a rim 111a on central spine 111d surrounding a bezel aperture 111b, which can coincide, or otherwise align, with spout aperture 108. Bezel aperture 111b can permit access to various components of sensor assembly 110 when it is installed in spout 102. In various embodiments, rim 111a can protrude at least partially through spout aperture 108 to fix lens bezel 111 and sensor assembly 110 in spout 102. Spout aperture 108 and bezel aperture 111b can be oblong, and can have longitudinal axes extending parallel to a longitudinal axis of spout 102 proximate the mounting location of sensor assembly 110.

Lens assembly 114 can include a lens 114a, a sensor 114b (not visible, but located beneath lens 114a), wires 114c, and latches 114d. In at least one embodiment, sensor 114b is or includes an infrared sensor 115a configured to detect objects within the vicinity of the sensor 114b. Wires 114c can be communicatively coupled to sensor 114b to power the sensor and to carry signals to and from control unit 120. In certain embodiments, lens assembly 114 can be disposed proximate the inner surface(s) of lens bezel 111 in a nesting arrangement. For example, lens assembly 114 can be positioned within the c-shaped opening of lens bezel 111 (e.g., defined by central spine 111d and ribs 111c), such that the lens assembly generally corresponds to the shape of the central spine in a longitudinal direction, and its width substantially extends across the width of the central spine. Lens assembly 114 can include a series of latches 114d disposed along the length of and on either side of the assembly. Latches 114d can extend substantially perpendicularly toward lens bezel 111, when lens assembly 114 is positioned within the opening of the lens bezel. Latches 114d can also be configured to engage notches 111e of lens bezel 111 to detachably couple lens assembly 114 to lens bezel 111. In this way, lens assembly 114 (and thus sensor 114b) can be retained in spout 102 by way of lens bezel 111, and in a manner that substantially decouples the lens assembly from spray head 104 and hose 122. This advantageously minimizes the impact of potentially harmful stresses on sensor 114b owing to repeated engagement and disengagement of spray head 104 from spout 102.

According to various embodiments, shutter 112 can be disposed between latches 114d and notches 111e when the latches are engaged with the notches. As illustrated in FIG. 1, shutter 112 can be disposed such that it is visible and physically accessible through spout aperture 108. Shutter 112 can be displaceable in a slide track (e.g., disposed in the spout aperture and configured as part of shutter 112, lens bezel 111, or lens assembly 114) along the longitudinal axis of spout aperture 108 and bezel aperture 111b to cover or obscure and to uncover or expose lens 114a and/or sensor 114b to the environment. In various embodiments, the shutter and slide track can be configured to prevent water and/or particle build-up proximate the sensor assembly 110, and can, for example, be designed to be easily plastic injection molded. Obscuring lens 114a and/or sensor 114b with shutter 112 can cause sensor 114b to generate and transmit one or more control signals to control unit 120 to set faucet 100 to a normal, manual control mode (in which water flow 130 through spout 102 is controlled solely by adjusting handle and the mixing valve of mixing valve assembly 106). In contrast, moving shutter 112 such that lens 114a and/or sensor 114b are exposed can allow the sensor to detect objects in proximity thereto via spout aperture 108 and lens bezel aperture 111b. It can also allow the sensor to generate and transmit one or more control signals to control unit 120 to set faucet 100 to the sensor-based mode (in which water flow 130 through spout 102 is controlled based on the detection of nearby objects).

In certain embodiments, shutter 112 can include or more magnets 131 (e.g., embedded in or disposed on shutter 112), and sensor 114b can include a Hall Effect Sensor 115b ("HES") configured in a magnetic detection circuit (not visible in the drawing figures). The HES 115b and detection circuit can, for example, be disposed within or external to a housing of the infrared sensor 115a, and can generally be used to determine the position of shutter 112. The detection circuit can include one or more resistive components coupled to the HES 115b, a power source, and ground, and can be configured to control the infrared sensor 115a and control unit 120 (or more particularly, a solenoid valve thereof, such as solenoid valve 123, described in further detail below). In this configuration, obscuring sensor 114b by closing shutter 112 may not directly trigger sensor 114b (e.g., the infrared sensor 115a thereof) to generate a control signal operative to set faucet 100 to the manual control mode. Rather, when shutter 112 is moved from its open position to its closed position, the magnet(s) 131 thereof can be positioned proximate the HES 115b, which can cause the detection circuit to deactivate (e.g., electrically) the infrared sensor 115a or a circuit thereof, and to transmit one or more electrical control signals to control unit 120 to open the solenoid valve. Faucet 100 can then be operated manually using handle of mixing valve assembly 106 in the manual control mode. On the other hand, exposing sensor 114b by opening shutter 112 may not directly trigger the infrared sensor 115a to generate a control signal operative to set faucet 100 to the sensor-based mode. Rather, when shutter 112 is moved from its closed position to its open position, the magnet(s) 131 thereof are moved away from the HES 115b which can cause the detection circuit to activate (e.g., electrically) the infrared sensor 115a or a circuit thereof, and to transmit one or more electrical control signals to control unit 120 to close solenoid valve 123. The infrared sensor 115a can then control operation of faucet 100 in the sensor-based mode by subsequently opening or closing solenoid valve 123 based on the detection of nearby objects.

It is to be understood that shutter 112 can alternatively be at least partially composed of magnetic material, in which case separate magnet(s) are not required. It is also to be understood that other types of magnetic-based electronic mechanisms (e.g., a magnetic reed switch or the like) can be employed in sensor 114b to generate the control signals.

According to at least one embodiment, lens bezel 111 can include a tab 111f having a shape that complements the shape of a bar of wire harness 118, and can abut and latch the lens bezel to the wire harness. Wire harness 118 can extend from the tab 111f to a base end of spout 102 opposite the tap, and can segregate and/or protect wires 114c from hose 122 within spout 102. Wire harness 118 can be flexible and modular, and can be pressed against the inner surface of spout 102 such that it follows the contours of the spout. In at least one embodiment, wire harness 118 can be truncated from a longer harness to a length suitable for use in spout 102. Thus, wire harnesses can be cut to length to adapt for use in spout tubes having varying lengths.

According to various embodiments, lens assembly 114 can be decoupled from spray head 104 and hose 122 in spout 102 by means of hose guide 116. Hose guide 116 can be c-shaped, can be insertable into spout tube 102, and can have ends configured to clip, latch, or otherwise fix, to one or more components of sensor assembly 110 (such as, e.g., notches 111e) and/or spout 102. In an assembled configuration, hose guide 116 can guide hose 122 (e.g., against the interior surface of the hose guide) during extension and retraction of spray head 104, which can promote smooth operation of faucet 100, and can prevent hose 122 from rubbing against lens assembly 114, lens bezel 111, and spout 102, and/or pulling down on lens bezel 111 and lens assembly 114.

It should be appreciated that sensor 114b can be or include other types of sensors, such as, for example, a capacitive sensor (e.g., a capacitive touch sensor or a touch-free capacitive sensor), an inductive sensor, a laser rangefinder, a magnetic sensor, an ultrasonic sensor, or the like. Depending on the type of sensor employed, different types of lens 114a having different shapes can be used to accommodate the sensor. For example, in the scenario where sensor 114b detects objects using electromagnetic radiation, lens 114a can be configured to focus incident radiation onto the sensor. As another example, in the scenario where other types of sensing mechanisms are used (such as capacitive or inductive sensors), lens 114a can simply serve as a cover that protects sensor 114b from environmental elements that might interfere with the sensor's functions (such as, for example, air, oils, dirt, dust, water, and/or other dry, liquid, or gaseous substances). Furthermore, any of these sensor types can be employed in conjunction with shutter 112 (whether equipped with the magnet detection circuit described above or not) to control the operating mode of faucet 100. For example, faucet 100 can employ a touch-free capacitive sensor node that is activatable and de-activatable via shutter 112 (or other switch device) to provide automatic touch (or touch-free, proximity) or manual control modes of operation.

Figure 5:
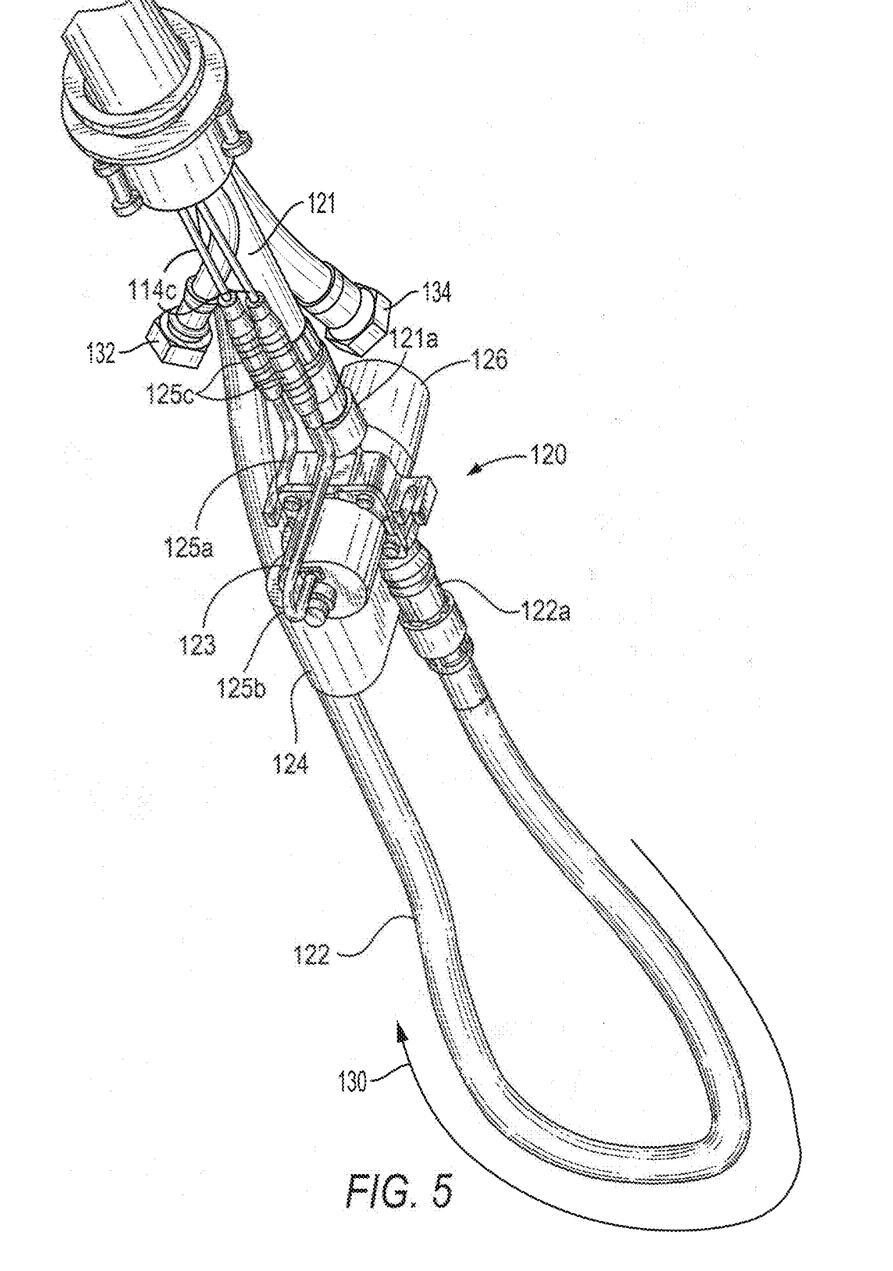
FIG. 5 is a perspective view of an exemplary control unit of a sensor-operated pull-out faucet, in accordance with an embodiment of the present invention.
Figure 6:
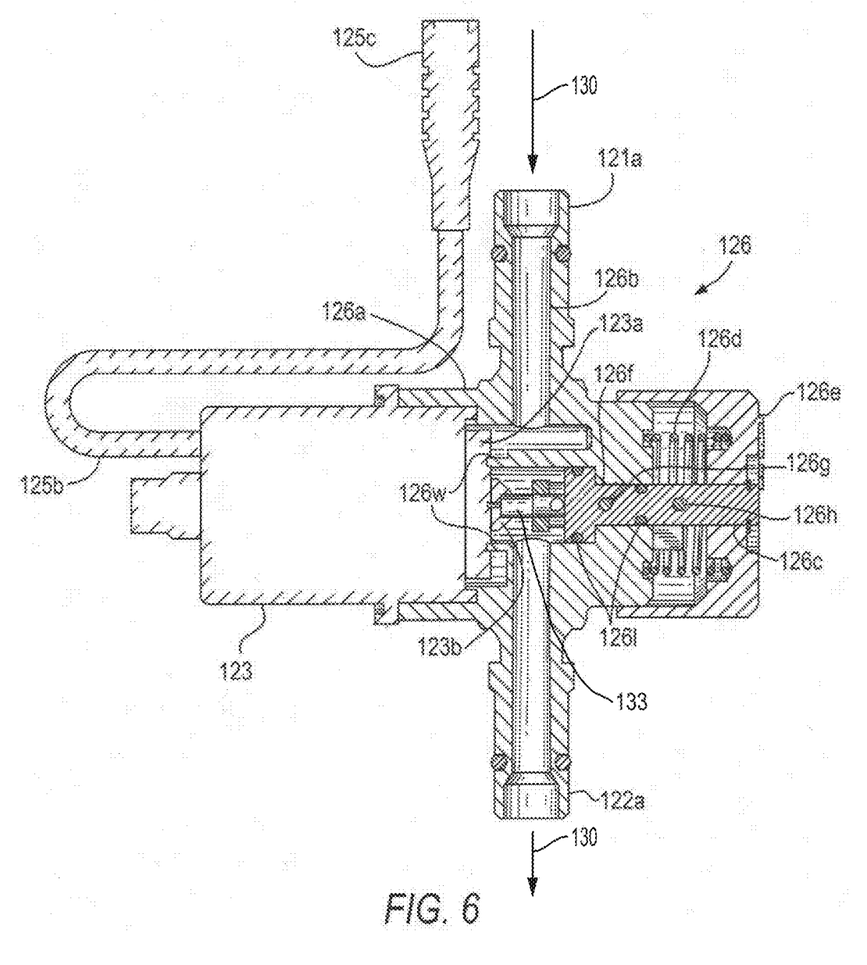
FIG. 6 is a partially cutaway cross-sectional view of the control unit of FIG. 5, in accordance with an embodiment of the present invention.
Figure 7:
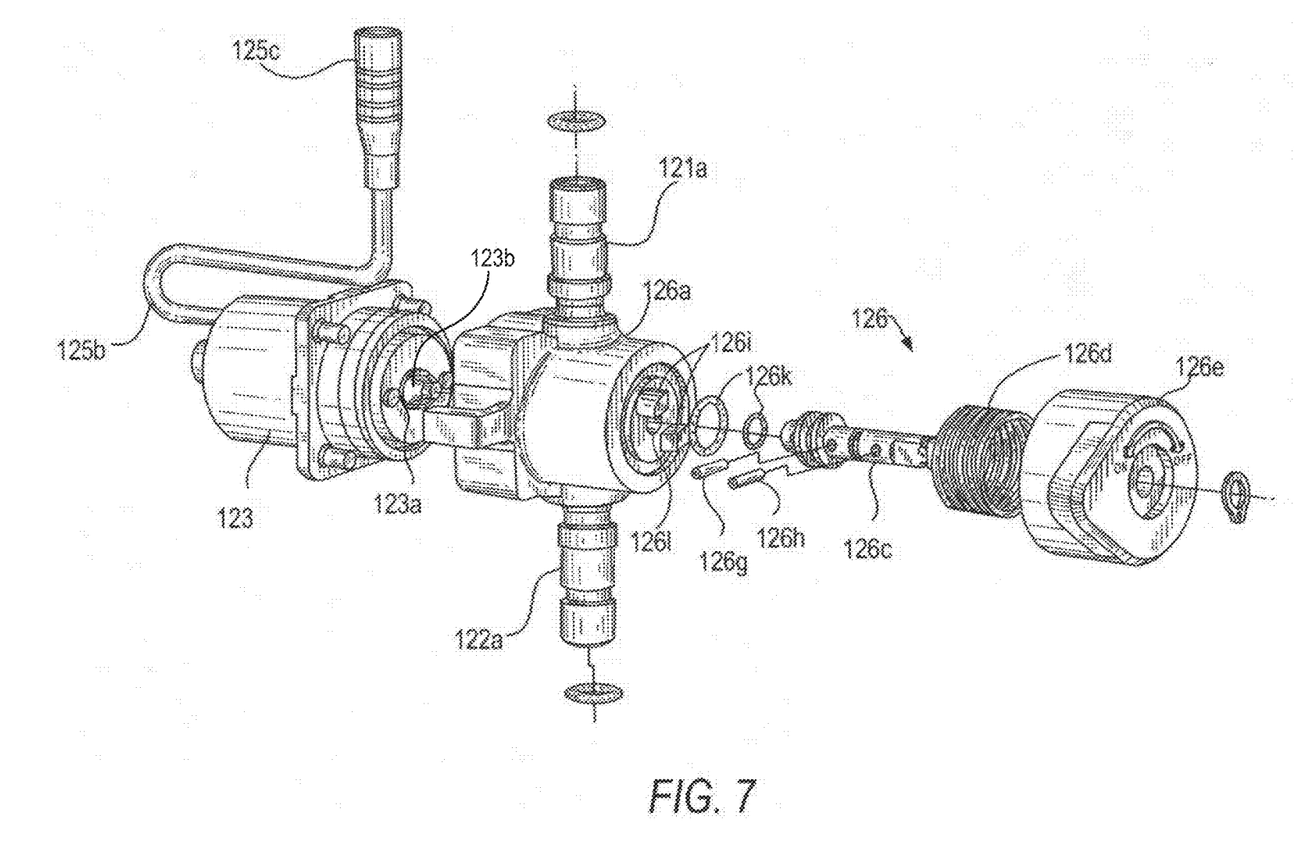
FIG. 7 is an exploded view of the control unit of FIGS. 5 and 6, in accordance with an embodiment of the present invention.
Figures 8, 9:
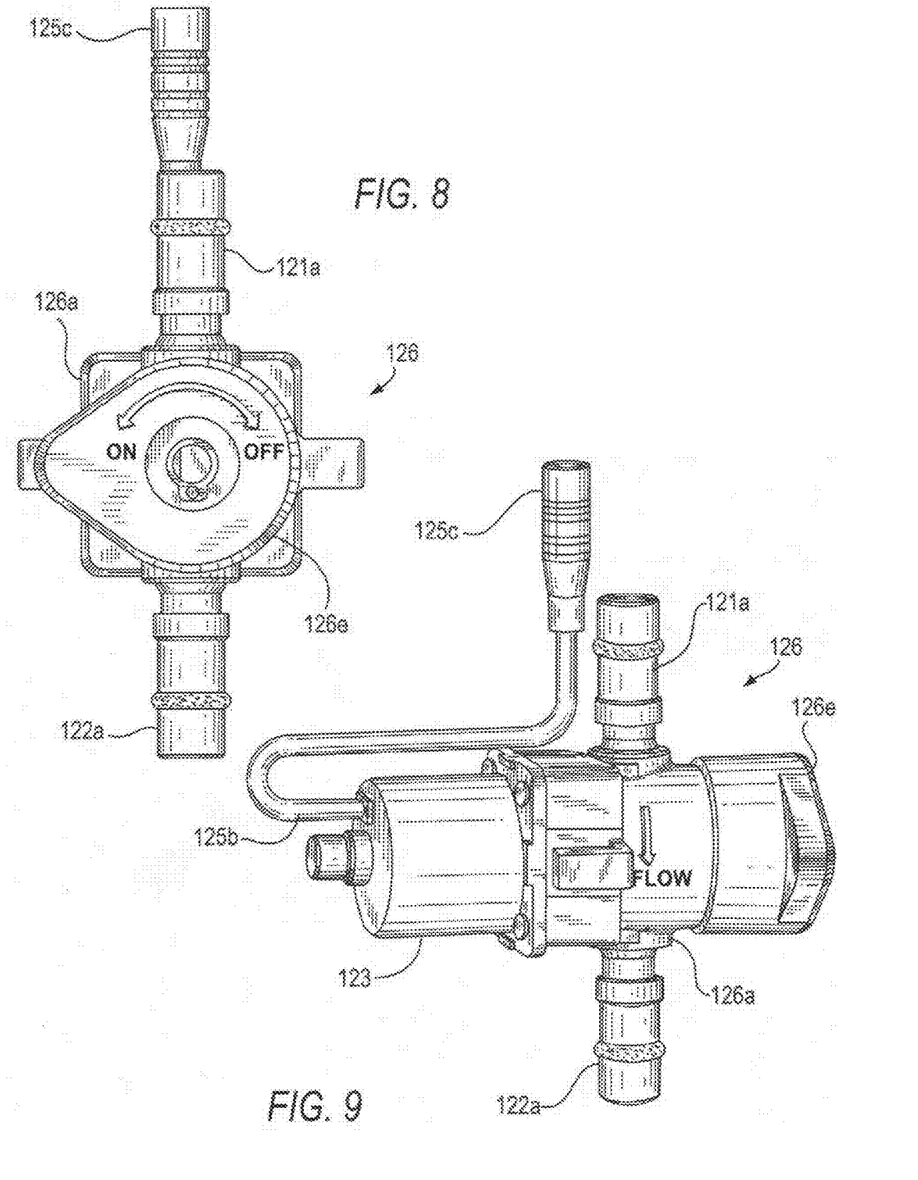
FIG. 8 is a side view of the control unit of FIGS. 5-7, in accordance with an embodiment of the present invention.
FIG. 9 is a perspective view of the control unit of FIGS. 5-8, in accordance with an embodiment of the present invention.

FIG. 5 is a perspective view of a control unit 120. FIGS. 6-8 are partially cutaway cross-sectional, exploded, and side views of control unit 120. FIG. 9 is another perspective view of control unit 120. Generally speaking, control unit 120 can be utilized to control the flow of water through faucet 100 based at least in part on control signals generated by sensor 114b.

Control unit 120 can include a fluid input connection 121a configured to couple to an input hose 121 (which can, for example, fluidly connect the mixing valve of mixing valve assembly 106 to control unit 120), a fluid output connection 122a configured to couple to hose 122, a control solenoid valve 123, a battery 124, power wire(s) 125a, a signal wire 125b, electronic couplings 125c. A hot water hose 132 and a cold water hose 134 can be fluidly coupled to hot and cold water supply lines (not shown) using conventional coupling devices. Hot water hose 132 and cold water hose 134 can also be fluidly coupled to the mixing valve of mixing valve assembly 106, which can direct water flow 130 to input connection 121a via input hose 121.

Solenoid valve 123 can include a diaphragm 123a configured to interact with walls 126w in control unit 120 (which can, for example, function as a valve seat). In its expanded state (as illustrated in FIG. 6), diaphragm 123a can contact walls 126w and block fluid passage 126b, which can prevent any water at input connection 121a to pass to output connection 122a. In its retracted state, diaphragm 123a does not (or only slightly) contacts walls 126w, which can open fluid passage 126b and allow water at input connection 121a to flow to output connection 122a.

In certain embodiments, solenoid valve 123 can include an internal plunger 133 disposed within and controllable by a solenoid coil. The solenoid coil can be coupled to one or more electrical connections. The plunger 133 can be composed of or include metal and/or magnetic material, and can be coupled, at one end, to diaphragm 123a (or a component attached thereto). Solenoid valve 123 can also include a fill hole at one end of the diaphragm, and a vent hole proximate the center of the diaphragm and aligned with the plunger 133. The fill hole can lead to an internal chamber that is fluidly connectable to fluid passage 126b via the vent hole, depending on the position of the plunger 133.

In various embodiments, solenoid valve 123 can be configured to effect movement of diaphragm 123a based on electrical control signals from sensor 114b. As illustrated in FIG. 5, solenoid valve 123 can receive, via its electrical connection(s), control signals from sensor 114b over signal wire 125b and the wire 114c coupled to the signal wire. The control signals can instruct, or otherwise cause, the solenoid coil of solenoid valve 123 to manipulate diaphragm 123a. To open the valve, sensor 114b can generate and deliver control signals over wires 114c to create a magnetic field in the solenoid coil. The magnetic field can cause the internal plunger 133 to move away from (and thus unplug) the vent hole. With the vent hole unplugged, pressurized water in the solenoid valve's internal chamber can pass through the vent hole into output connection 122a. When the water pressure below diaphragm 123a exceeds the pressure in the internal chamber, the diaphragm can be forced up off of the valve seat, allowing water from input connection 121a to flow over the weir of the valve seat. It is to be appreciated that, in various embodiments, the magnetic field can additionally, or alternatively, cause the internal plunger 133 to pull, or otherwise retract, diaphragm 123a from walls 126b to open fluid passage 126b.

On the other hand, to close the valve, sensor 114b can generate and deliver control signals over wires 114c to create an opposite magnetic field in the solenoid coil. This magnetic field can cause the internal plunger 133 to move toward (and thus plug) the vent hole. With the vent hole plugged, water present at input connection 121a can enter and pressurize the solenoid valve's internal chamber via the diaphragm's fill hole. When the water pressure above diaphragm 123a exceeds the pressure in below the diaphragm, the diaphragm is forced down onto the valve seat, closing fluid passage 126b and preventing water from flowing over the weir of the valve seat to the output connection 122a.

In operation, when faucet 100 is set to the sensor-based mode (e.g., by opening shutter 112) and no object is yet detected by sensor 114b, the internal plunger 133 can plug the diaphragm's vent hole and/or press diaphragm 123a against walls 126w, such that fluid passage 126b remains closed. In this scenario, if handle and the mixing valve of mixing valve assembly 106 have previously been adjusted to provide water at a desired temperature and flow rate (e.g., as described above), water from the mixing valve is delivered to input connection 121a, but is prevented from flowing to output connection 122a. Rather, the water can merely enter and rest in the solenoid valve's internal chamber via the diaphragm's fill hole. When an object is later detected by sensor 114b (e.g., within a predetermined range, such as six inches, twelve inches, or any other suitable range), the sensor can transmit one or more electrical control signals to the solenoid coil operative to move the internal plunger 133 and unplug the vent hole and/or to pull diaphragm 123a away from walls 126b. This can open fluid passage 126b and allow water present at input connection 121a to flow to output connection 122a and spray head 104 for output.

In various embodiments, when faucet 100 is to be switched to the manual control mode (e.g., by closing shutter 112 as described above), sensor 114b can transmit one or more control signals to solenoid valve 123 to cause diaphragm 123a to assume its retracted position and open fluid passage 126b. In this scenario, handle of mixing valve assembly 106 can be adjusted to manipulate mixing valve of mixing valve assembly 106 to output water at a desired temperature and flow rate. Water from the mixing valve of mixing valve assembly 106 can then be delivered through control unit 120 (e.g., through input connection 121a, fluid passage 126b, and output connection 122a) for output by spray head 104. Thus, in the manual control mode, water flow 130 through faucet 100 can be dictated solely via adjustment of handle and the mixing valve of mixing valve assembly 106.

According to various embodiments, sensor assembly 110 can be configured to provide "wave-on, wave-off" control of water flow 130. For example, in embodiments where sensor 114b is or includes an infrared sensor 115a, when shutter 112 is moved from its closed position to its open position, lens 114a can be exposed to detect nearby objects, and faucet 100 is operable in the sensor-based mode. However, when lens 114a detects an object in the detection zone of the infrared sensor 115a, the sensor 114b can transmit one or more control signals to solenoid valve 123 that not only causes fluid passage 126b to open and permit water flow 130 through faucet 100, but also maintains this condition until the object is no longer detected or until an object subsequently reenters the detection zone. That is, solenoid valve 123 can be controlled to keep fluid passage 126b open until it receives a subsequent control signal from sensor 114b indicative that the object is no longer detected within the predetermined range of sensor 114b, or that the object is detected again within the predetermined range while fluid passage 126b is open. When this occurs, sensor 114b can transmit one or more control signals to solenoid valve 123 to close fluid passage 126b and halt water flow 130 through spout 102.

According to at least one embodiment, sensor assembly 110 can be equipped with a timer (for example, in lens assembly 114 or in control unit 120) configured to prohibit water flow after a predetermined period of time elapses after the initial detection of an object. In this scenario, solenoid valve 123 can be controlled to open fluid passage 126b for a predetermined period of time (such as, e.g., five seconds, ten seconds, or fifteen seconds), based on control signals from sensor 114b. This advantageously prevents flooding or excessive water consumption that may result from inadvertent activation of the sensor. According to various embodiments, automatic operation of solenoid valve 123 can depend on a number of factors, including whether faucet 100 is located on public or private property, relevant water usage regulations, and the location of sensor 114b on faucet 100. For example, if faucet 100 is installed in a public place (where users may not be incentivized to limit their water usage) or if relevant water usage regulations dictate, solenoid valve 123 can be configured to keep fluid passage 126b open for only a limited amount of time. As another example, if sensor 114b is positioned or oriented on spout 102 (e.g., on a bottom portion of spout 102 opposite the aforementioned topside location) such that it can detect the presence of an object while the object is under the faucet, solenoid valve 123 can be configured to keep fluid passage 126b open until the object is no longer detected by sensor 114b. As yet another example and as described above, if sensor 114b is positioned or oriented on spout 102 (e.g., at the aforementioned topside location of spout 102 illustrated in FIG. 1) such that it can detect the presence of an object in proximity to the spout (other than underneath the tap), solenoid valve 123 can be configured to keep fluid passage 126b open until a subsequent control signal (indicative of sensor 114b detecting an object a subsequent time) is received from the sensor.

Solenoid valve 123 and sensor 114b can receive power from battery 124 via power wire(s) 125a. In various embodiments, a single power connection can extend between battery 124 and sensor 114b, particularly via power wire 125a, electronic coupling 125c, and one of wires 114c. In this scenario, both power and control signals can be carried from sensor 114b to solenoid valve 123 via the other wire 114c, the other electronic coupling 125c, and signal wire 125b. In alternate embodiments, power wires 125a can extend separately from battery 124 to sensor 114b and from battery 124 to solenoid valve 123. In this scenario, the other wire 114c, the other electronic coupling 125c, and signal wire 125b only carries control signals from sensor 114b to solenoid valve 123.

According to various embodiments, solenoid valve 123 can be normally closed such that, in the event of a power failure or power loss to solenoid valve 123 (e.g., due to a low or depleted battery), fluid passage 126b can remain closed, thereby preventing faucet 100 from turning on unexpectedly. In other embodiments, solenoid valve 123 can be normally opened.

Control unit 120 can also include a manual mechanical by-pass consisting of a rod or plunger configured to interact with the underside of the diaphragm (e.g., opposite the internal chamber of the solenoid valve). The by-pass can be operable to control the operating mode of faucet 100. In this way, either the by-pass or the solenoid valve can be employed to open or close fluid passage 126b.

Figure 10:
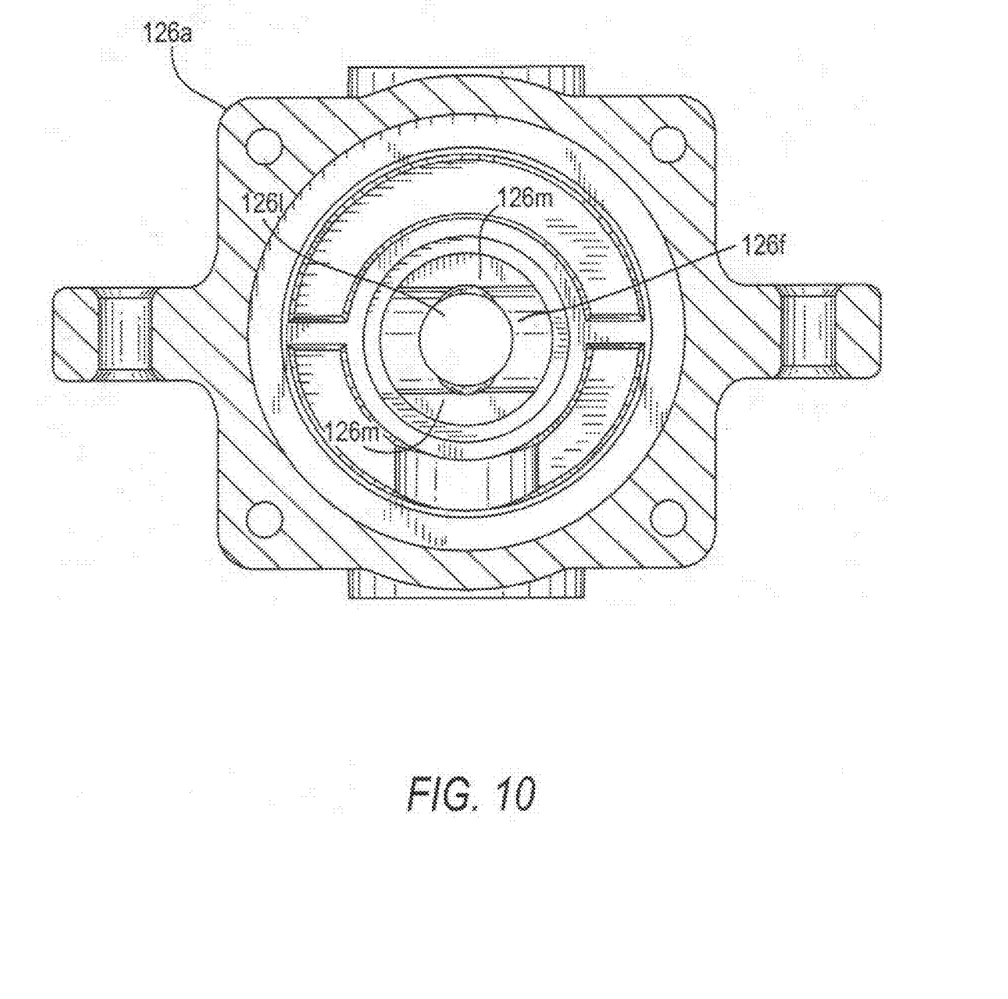
FIG. 10 is a side view of an exemplary manual control valve, in accordance with an embodiment of the present invention.

In various embodiments, the by-pass mechanism can be implemented as a manual bypass valve 126. Referring to FIGS. 5-9, manual control valve 126 can include a rotatable knob 126e, a spring 126d, and a plunger 126c oriented substantially perpendicularly to fluid passage 126b and seated in a bore 126l of a housing 126a (FIG. 10 is a side view of housing 126a). A first end of plunger 126c can extend in and out of fluid passage 126b, when the plunger is moved along a longitudinal axis of bore 126l. Plunger 126c can include two apertures for receiving, in a transverse direction, a first dowel 126g arranged within housing 126a and second dowel 126h arranged externally to housing 126a. When control unit 120 is assembled, knob 126e can be adjusted to manipulate plunger 126c and dowels 126g and 126h to provide manual control of the solenoid valve.

In operation, orienting knob 126e (e.g., in the position shown in FIGS. 6-9) can cause spring 126d to impart a force on plunger 126c and knob 126e, such that the plunger is urged as far as possible away from solenoid valve 123 (and is either remote from or in only slight contact with an actuator 123b of diaphragm 123a disposed, for example, at a center lower portion of the diaphragm). Additionally, first dowel 126g can be seated in a V-shaped groove 126f by virtue of the spring force of spring 126d (which can continually draw on plunger 126c such that first dowel 126g rests against V-shaped groove 126f). In this scenario, diaphragm 123a can be in an expanded state, and can press against walls 126w, blocking the flow of water from input connection 121a to output connection 122a. Faucet 100 can thus be freely switchable between the sensor-based and manual control modes (e.g., as controlled by sensor 114b based on the position of shutter 112).

In contrast, rotating knob 126e (e.g., by 90 degrees in a counter-clockwise direction) can set faucet 100 to the manual control mode. In this orientation of knob 126e, first dowel 126g can rotate and slide from V-shaped groove 126f to flat portions 126b, thereby urging plunger 126c farther into fluid passage 126b (e.g., by about 2 millimeters, about 2.5 millimeters, or about 3 millimeters to the left in FIG. 6, in opposition to the force of spring 126d) against actuator 123b. This can push diaphragm 123a away from the valve seat and open fluid passage 126b. First dowel 126g can rest against flat portions 126m and can be held in place by virtue of the spring force exerted by spring 126d. When fluid passage 126b is manually opened in this manner, water can flow over the weir of the valve seat to output connection 122a, and faucet 100 can be controlled completely via adjustment of the mixing valve assembly 106 (e.g., by handle), regardless of any control signals that sensor 114b might transmit to solenoid valve 123 in response to the detection of objects (and regardless of the state of solenoid valve 123). This by-pass of solenoid valve 123 by manual control valve 126 can, for example, allow continued use of faucet 100 (albeit manually) in the event of a power failure or failure of the electrical/electronic components of sensor assembly 110 and/or control unit 120 (such as solenoid valve 123). It is to be appreciated that plunger 126c can be mechanically actuated in any suitable manner, as long as the plunger effects movement of diaphragm 123a to control the flow of water. It is also to be appreciated that, in various embodiments, other valve types and/or configurations can be used in lieu of manual control valve 126 to provide by-pass control of solenoid valve 123.

According to various embodiments, manual control valve 126 can include projections 126i configured to interact with second dowel 126h. The protrusion of projections 126i can prevent plunger 126c from rotating beyond a predetermined rotational angle (e.g., 90° or "quarter-turn"). Furthermore, manual control valve 126 can also include O-rings 126k arranged between plunger 126c and bore 126l, and configured to prevent water in fluid passage 126b from leaking into the environment through bore 126l or generally leaking through plunger 126c.

In at least one embodiment, housing 126a can include a detent (e.g., formed in V-shaped groove 126f or between or integrated into projections 126i) configured to prevent plunger 126c from rotating back into the sensor-based control position after knob 126e is oriented to the manual control position. To switch faucet 100 to the sensor-based mode, knob 126e can be pushed toward housing 126a, to disengage one of dowels 126g and 126h from the detent, and then rotated back into the sensor-based control position such that first dowel 126g is seated in V-shaped groove 126f.

Fluid passage 126b can thus advantageously remain open in the manual control mode as directed by manual control valve 126. The mixing valve and handle of mixing valve assembly 106 can then be operated to adjust both temperature and water flow 130 through faucet 100 independently of sensor 114b and the position of shutter 112. Accordingly, whether water is permitted to flow through control unit 120 to hose 122 can be dictated by the position of solenoid valve 123 in the sensor-based mode, and by the position of manual bypass valve 126 in the manual control mode.

It is to be understood that other valves or valve configurations can alternatively be employed to open and close fluid passage 126b. For example, one or more electrically-operated valves, such as direct acting solenoid valves, motor-controlled or motorized actuator valves, piezo valves, micro-electromechanical system ("MEMS") valves, or the like, can be used in lieu of solenoid valve 123. Any of these valves can also be manipulated via a mechanical by-pass like manual control valve 126.

In certain embodiments, an alternative or additional manual by-pass valve (e.g., a ball valve) can be connected between the solenoid valve's internal chamber and the outlet waterway leading to output connection 122a. When the manual valve is in its open position, the pressure in the internal chamber above diaphragm 123a can be relieved, allowing the inlet water pressure below the diaphragm to force the diaphragm off of the valve seat. Water is then permitted to flow over the weir of the valve seat to output connection 122a, and faucet 100 can operate in the normal, manual control mode (e.g., via handle and the mixing valve of mixing valve assembly 106).

It is to be appreciated that one or more electrically-controlled valves (e.g., solenoid valve 123) can be disposed at any point in the water path in faucet 100, from the inlet hot and cold water lines to the end of spout 102, as long as appropriate control of water flow 130 through faucet 100 is provided. Thus, in various embodiments, rather than having a solenoid valve in the mixed water line between the mixing valve and spout 102, one or more electrically-controlled valves can alternatively be disposed in the inlet water lines upstream of the mixing valve. In this scenario, shutter 112 and sensor assembly 110 can be similarly utilized to control water flow 130 through spray head 104.

It is also to be appreciated that various faucet types (including faucets not equipped with pull-out or pull-down spray heads) can also employ the sensor assembly and control unit features described above. For example, a standard fixed spout faucet and/or a faucet having separate hot and cold water valves can be enhanced with the various mode switching mechanisms (such as sensor assembly 110, lens bezel 111, control unit 120, etc.). Furthermore, one or more manual control valves can be employed as manual by-pass mechanisms for overriding the hot and cold water valves (e.g., similar to manual control valve 126 described above).

It will thus be seen that the aspects, features and advantages made apparent from the foregoing are efficiently attained and, since certain changes may be made without departing from the spirit and scope of the invention, it is intended that all matter contained herein shall be interpreted as illustrative and not in a limiting sense.

The invention claimed is:

1. A faucet comprising:
   a spout having a hose disposed therein;
   a pull-out spray head fluidly coupled to the hose and configured to dock at an end of the spout;
   a sensor assembly disposed at least partially in the spout proximate the end of the spout, the sensor assembly comprising a sensor and a shutter disposed adjacent the sensor, the shutter being configured to obscure the sensor in a closed state of the shutter and expose the sensor in an open state of the shutter;
   a lens bezel that partially wraps around the hose within the spout and secures the sensor assembly within the spout, wherein the lens bezel comprises a central spine having a bezel aperture defined therein and a slide track that allows the shutter to slide along the direction of the central spine between the open state and the closed state, and wherein the shutter is operable to expose the sensor in the open state through the bezel aperture; and
   a control unit, communicatively coupled to the sensor, and configured to control fluid flow through the hose and the pull-out spray head based on control signals generated by the sensor.

2. The faucet of claim 1, wherein the sensor includes an infrared sensor.

3. The faucet of claim 1, further comprising at least one wire communicatively coupling the control unit to the sensor.

4. The faucet of claim 1, wherein the control unit comprises a manual control valve and is configured to:
   in a first position, set the faucet to operate in a manual control mode, in which the fluid flow through the pull-out spray head is controlled based on a mixing valve assembly of the faucet, and
   in a second position, permit the faucet to be freely switchable, by means of the sensor and the shutter, between the manual control mode and a sensor-based mode, in which the fluid flow through the pull-out spray head is controlled based on the control signals.

5. The faucet of claim 1, further comprising a hose guide configured to prevent the hose from contacting the lens assembly during extension and retraction of the pull-out spray head.

6. The faucet of claim 1, wherein the sensor assembly further comprises a lens disposed over the sensor.

7. The faucet of claim 6, wherein the shutter is disposed over the lens and operable to obscure the lens in the closed state and expose the lens in the open state.

8. The faucet of claim 1, wherein the sensor includes a Hall Effect Sensor.

9. The faucet of claim 8, wherein the shutter includes at least one magnet configured to cause the Hall Effect Sensor to generate control signals operative to switch the faucet between the sensor-based mode, in which the fluid flow through the pull-out spray head is controlled based on the control signals, and the manual control mode, in which the fluid flow is controlled based on a mixing valve assembly of the faucet.

10. The faucet of claim 1, wherein the control unit comprises:
    an input connection fluidly coupled to a mixing valve assembly of the faucet;
    an output connection fluidly coupled to the hose; and
    a fluid passage connecting the input and output connections.

11. The faucet of claim 10, wherein the control unit further comprises a solenoid valve configured to open and close the fluid passage based on the control signals.

12. The faucet of claim 1, further comprising a spout aperture defined in the spout.

13. The faucet of claim 12, wherein the sensor is disposed in the spout aperture.

14. The faucet of claim 12, wherein the lens bezel is disposed at the spout aperture and configured to retain the sensor to an inner surface of the spout.

* * * * *